United States Patent
Yu et al.

(10) Patent No.: US 10,663,698 B2
(45) Date of Patent: May 26, 2020

(54) OPTICAL ASSEMBLIES INCLUDING A SPACER ADHERING DIRECTLY TO A SUBSTRATE

(71) Applicant: AMS SENSORS SINGAPORE PTE. LTD., Singapore (SG)

(72) Inventors: Qichuan Yu, Singapore (SG); Kam Wah Leong, Singapore (SG); Ji Wang, Singapore (SG)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/755,221

(22) PCT Filed: Aug. 25, 2016

(86) PCT No.: PCT/SG2016/050411
§ 371 (c)(1),
(2) Date: Feb. 26, 2018

(87) PCT Pub. No.: WO2017/034483
PCT Pub. Date: Mar. 2, 2017

(65) Prior Publication Data
US 2018/0239116 A1  Aug. 23, 2018

Related U.S. Application Data

(60) Provisional application No. 62/210,569, filed on Aug. 27, 2015.

(51) Int. Cl.
*G02B 7/02* (2006.01)
*G02B 13/00* (2006.01)
(Continued)

(52) U.S. Cl.
CPC .... *G02B 13/0085* (2013.01); *B29C 45/14467* (2013.01); *B29C 45/1701* (2013.01);
(Continued)

(58) Field of Classification Search
CPC .......... G02B 7/02; G02B 7/021; G02B 7/022; G02B 7/023; G02B 7/026; G02B 7/025;
(Continued)

(56) References Cited

U.S. PATENT DOCUMENTS

2009/0256931 A1\* 10/2009 Lee .......................... H01L 24/97
348/231.99
2010/0073533 A1\* 3/2010 Yano ................ B29D 11/00432
348/294
(Continued)

FOREIGN PATENT DOCUMENTS

WO    2015/016776    2/2015
WO    2015/053706    4/2015

OTHER PUBLICATIONS

ISA/AU, International Search Report for PCT/SG2016/050411 (dated Nov. 22, 2016).

*Primary Examiner* — William R Alexander
*Assistant Examiner* — Tamara Y. Washington
(74) *Attorney, Agent, or Firm* — Michael Best & Friedrich LLP

(57) ABSTRACT

This disclosure describes optical assemblies that can be fabricated, for example, using wafer-level processes. The process can include providing a wafer stack that includes an optics wafer, and molding spacers directly onto the surface of the optics wafer. The spacers can be molded, for example, using a vacuum injection technique such that they adhere to the optics wafer without adhesive.

11 Claims, 6 Drawing Sheets

(51) Int. Cl.
*G02B 6/32* (2006.01)
*H01L 27/146* (2006.01)
*B29C 45/14* (2006.01)
*B29C 45/17* (2006.01)
*B29K 63/00* (2006.01)
*B29L 11/00* (2006.01)

(52) U.S. Cl.
CPC ........ *G02B 6/325* (2013.01); *H01L 27/14625* (2013.01); *B29K 2063/00* (2013.01); *B29L 2011/0016* (2013.01)

(58) Field of Classification Search
CPC .......... G02B 7/04; G02B 7/028; G02B 7/102; H04N 5/2254; H04N 5/2252; H04N 2201/02458; H04N 2201/02474
USPC ............................................ 359/808; 257/98
See application file for complete search history.

(56) References Cited

U.S. PATENT DOCUMENTS

| | | | |
|---|---|---|---|
| 2010/0073534 A1* | 3/2010 | Yano | B29D 11/00432 348/294 |
| 2012/0307139 A1* | 12/2012 | Cheng | G02B 7/02 348/374 |
| 2013/0267273 A1 | 10/2013 | Rudmann | |
| 2014/0183585 A1 | 7/2014 | Gubser et al. | |
| 2016/0216138 A1 | 7/2016 | Rudmann et al. | |
| 2016/0349414 A1 | 12/2016 | Rudmann et al. | |
| 2017/0108699 A1 | 4/2017 | Perez Calero et al. | |

\* cited by examiner

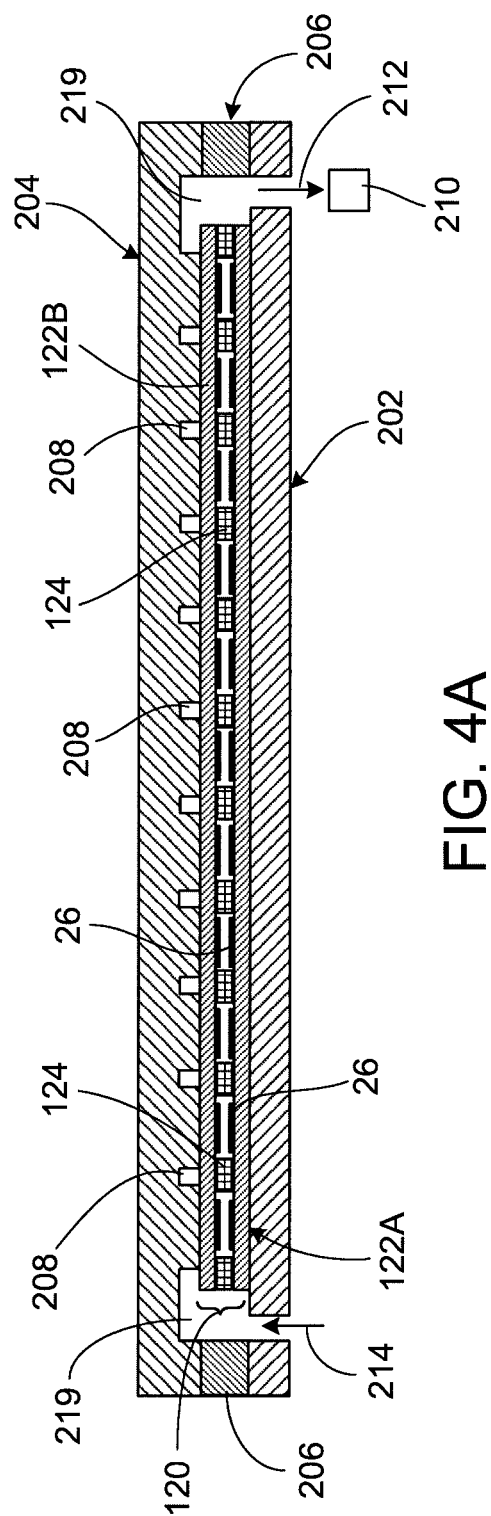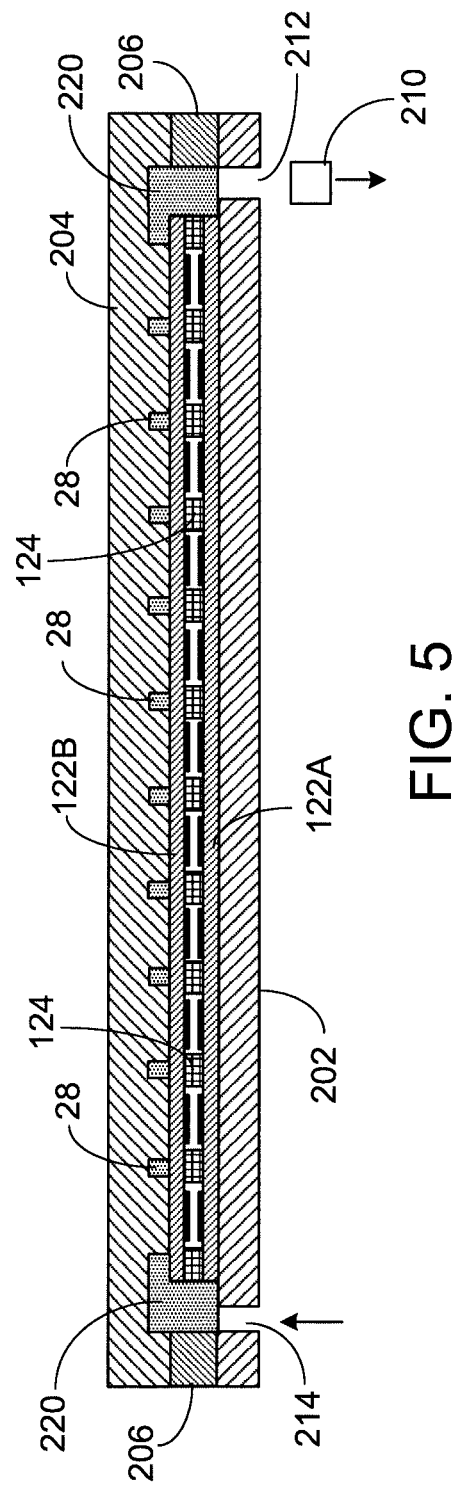

OPTICAL ASSEMBLIES INCLUDING A SPACER ADHERING DIRECTLY TO A SUBSTRATE

FIELD OF THE DISCLOSURE

This disclosure relates to optical assemblies that include a spacer that adheres directly to a substrate, as well as fabrication techniques for such optical assemblies.

BACKGROUND

Small optoelectronic modules such as imaging devices sometimes employ optical assemblies that include lenses stacked along the device's optical axis to achieve desired performance. In some instances, as part of the fabrication process, wafers that form the stack are aligned and bonded together. The wafers may be attached to one another, for example, by glue or other adhesive. The glue, however, sometimes migrates to areas that can negatively impact optical performance.

Further, in some instances, relatively thin spacer wafers are used to separate various optical members in the stack from one another or to separate the optical assembly from other optoelectronic components in a module. The use of thin spacer wafers can be advantageous because it helps to reduce the overall height of the assembly or module. On the other hand, distortion of such wafers can occur during processing. Further, the spacer wafers sometimes are composed of an epoxy material, which may absorb moisture. The absorption of such moisture can result in relatively large dimensional changes to the wafer, which can negatively impact the optical performance of the assembly.

SUMMARY

This disclosure describes optical assemblies that include a spacer that adheres directly to a substrate, as well as fabrication techniques for such optical assemblies. The optical assemblies can be fabricated, for example, using wafer-level processes in which many assemblies are fabricated at the same time in parallel. The process can include providing a wafer stack that includes an optics wafer, and molding spacers directly onto the surface of the optics wafer. The spacers can be molded, for example, using a vacuum injection technique such that they adhere to the optics wafer without adhesive.

In one aspect, for example, a wafer-level method of fabricating optical assemblies includes providing a wafer stack that includes a plurality of wafers stacked one over the other, the plurality of wafers including an optics wafer. Subsequently, spacers are molded directly onto a surface of the optics wafer, wherein the spacers adhere to the surface of the optics wafer without adhesive.

Some implementations include one or more of the following features. For example, in some instances, the spacers are formed by vacuum injection. The vacuum injection can include injecting epoxy into spaces defined by a vacuum injection tool. In some cases, during the vacuum injection, some of the epoxy is disposed along the circumference of the respective wafers in the wafer stack and also may be disposed along the surface of the optics wafer at its periphery and/or along a surface of the wafer stack at an end of the wafer stack opposite that of the optics wafer.

Another aspect describes an optical assembly that includes first and second substrates separated from one another by a first spacer having an opening, wherein the substrates are transparent to a particular wavelength or range of wavelengths. The optical assembly can include a beam shaping element on at least one of the substrates. The assembly further includes a second spacer attached directly to a surface of the second substrate such that the first and second spacers are on opposite sides of the second substrate and the second spacer adheres to the surface of the second substrate without adhesive. The outer lateral dimensions of the first and second substrates and the first and second spacers can be the same as one another.

In some instances, the second spacer is molded on the surface of the second substrate, comprises an epoxy material (e.g., a vacuum injected epoxy). The first and second substrates can be composed, for example, of a material selected from a group consisting of: glass, polymer. In some cases, a respective beam shaping element is provided on each of the first and second substrates.

Some implementations provide one or more of the following advantages. For example, since adhesive is not needed to adhere the molded spacers to the optics wafer, the wafer-level process can help alleviate problems that otherwise might occur if glue or other adhesive were used (e.g., migration of the glue to sensitive areas of the wafer stack; absorption of moisture into the spacer wafer). Further, molding the spacers directly onto the optics wafer can, in some implementations, reduce misalignment and/or handling distortions.

Various examples are described in greater detail below. Other aspects, features and advantages will be readily apparent from the following detailed description, the accompanying drawings and the claims.

BRIEF DESCRIPTION OF THE DRAWINGS

FIG. 4A illustrates an example of a wafer stack in a vacuum injection tool.

FIG. 5 illustrates the wafer stack in the vacuum injection tool during formation of spacers on the optics wafer.

DETAILED DESCRIPTION

Figure 1:
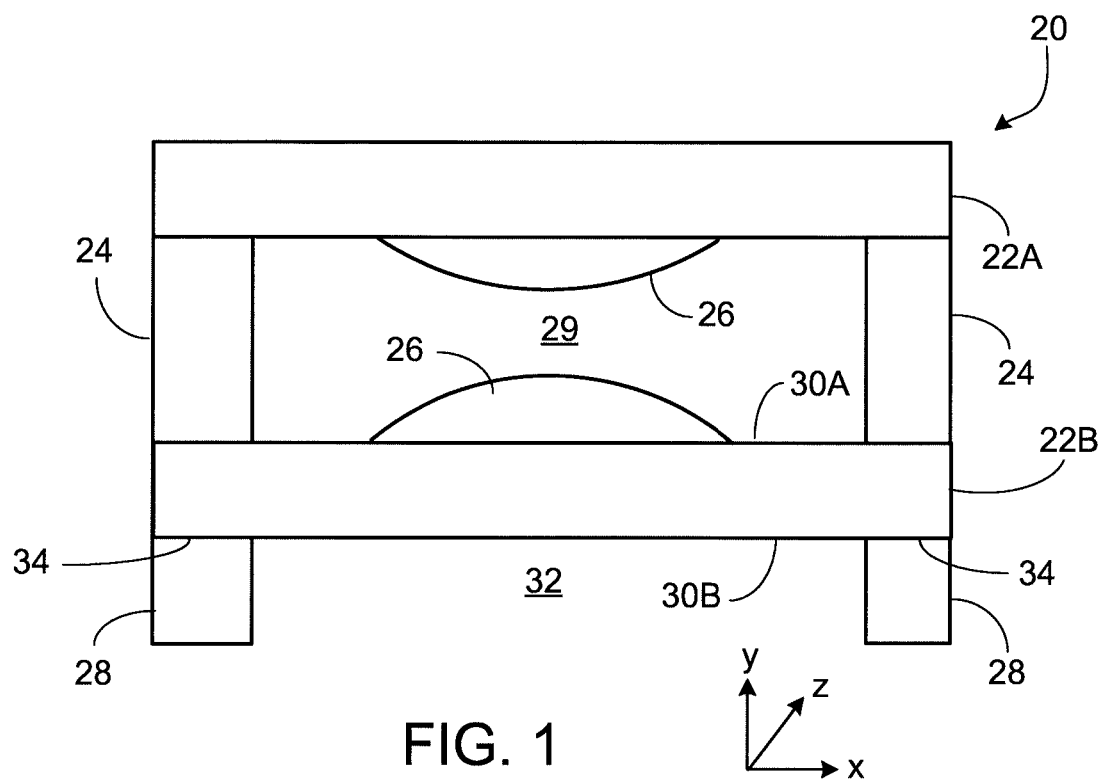
FIG. 1 illustrates an example of an optical assembly.

FIG. 1 illustrates an example of an optical assembly 20 that includes first and second transparent substrates 22A, 22B attached to one another, by way of a first spacer 24, to form a stack. The substrates 22A, 22B may be composed, for example, of glass or polymer. In some cases, one or both of the substrates 22A, 22B may include one or more optical filters on their surface(s) so as to allow light (e.g., infra-red or visible) only of a particular wavelength or range of wavelengths to pass through the assembly 20.

One or more of the transparent substrates 22A, 22B can include at least one lens or other beam shaping element 26 on one or both of their surfaces. Although the illustrated example shows at least one lens 26 on each of the transparent substrates 22A, 22B, in some cases, lenses or other beam shaping elements may be present on only one of the transparent substrates and may be present on one or both sides of a given substrate. In some cases, only one of the substrates 22A, 22B may have a lens on its surface.

The first spacer 24 separates the transparent substrates 22A, 22B from one another and may have, for example, an annular shape, or a rectangular shape with an opening 29 in the middle, so as to surround the lenses 26 laterally. The transparent substrates 22A, 22B can be attached to opposite ends of the first spacer 24, for example, by glue other adhesive.

As described above, the first spacer 24 is attached to a first surface 30A of the second substrate 22B. In addition, a second spacer 28 can be provided on a second, opposite surface 30B of the second substrate 22B. Like the first spacer 24, the second spacer 28 can have, for example, an annular shape, or a rectangular shape with an opening 32 in the middle. In some instances, the optical assembly 20 may be positioned, for example, over a printed circuit board (PCB) on which a light emitting or light detecting element (e.g., a LED, an OLED, a laser chip, a VCSEL, a photodiode, an image sensor) is mounted. In such implementations, the second spacer 28 can ensure a well-defined distance between the light emitting or detecting surface and the optical elements in the assembly. The outer lateral dimensions of the substrates 22A, 22B and the spacers 24, 28 (i.e., along the x and z axes in FIG. 1) can be substantially the same as one another.

In some implementations, the first spacer 24 is composed of a polymer material, for example, a hardenable (e.g., curable) polymer material, such as an epoxy resin that is substantially opaque to the wavelength(s) of interest. In some cases, one or both of the spacers 24, 28 are of a thermosetting polymer material, a UV-curing polymer material or a visible light-curing polymer material, and further include one or more pigments, inorganic fillers and/or dyes that make the spacers substantially non-transparent (i.e., opaque) to light of the particular wavelength or range of wavelengths in connection with which the optical assembly 20 is intended to be used. The second spacer 28 can be composed of a vacuum injected resin or other polymer.

Whereas the first spacer 24 may be attached to the substrates 22A, 22B by an adhesive, the second spacer 28 is molded directly onto the surface 30B of the second substrate 22B. As described in greater detail below, a vacuum injection molding process can be used to form the second spacer 28. Such a technique allows the second spacer 28 to be provided on and fixed to the second substrate 22B without the use of glue or other adhesive. Thus, although the spacer 28 may be composed of a material different from the material of the transparent substrate 22B, there is no glue or other adhesive at the boundary 34 where the spacer 28 and substrate 22B meet.

Optical assemblies like the assembly 20 can be fabricated in a wafer-level process, which allows multiple assemblies to be fabricated at the same time. Generally, a wafer refers to a substantially disk- or plate-like shaped item, its extension in one direction (y-direction or vertical direction) is small with respect to its extension in the other two directions (x- and z- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

Figure 2:
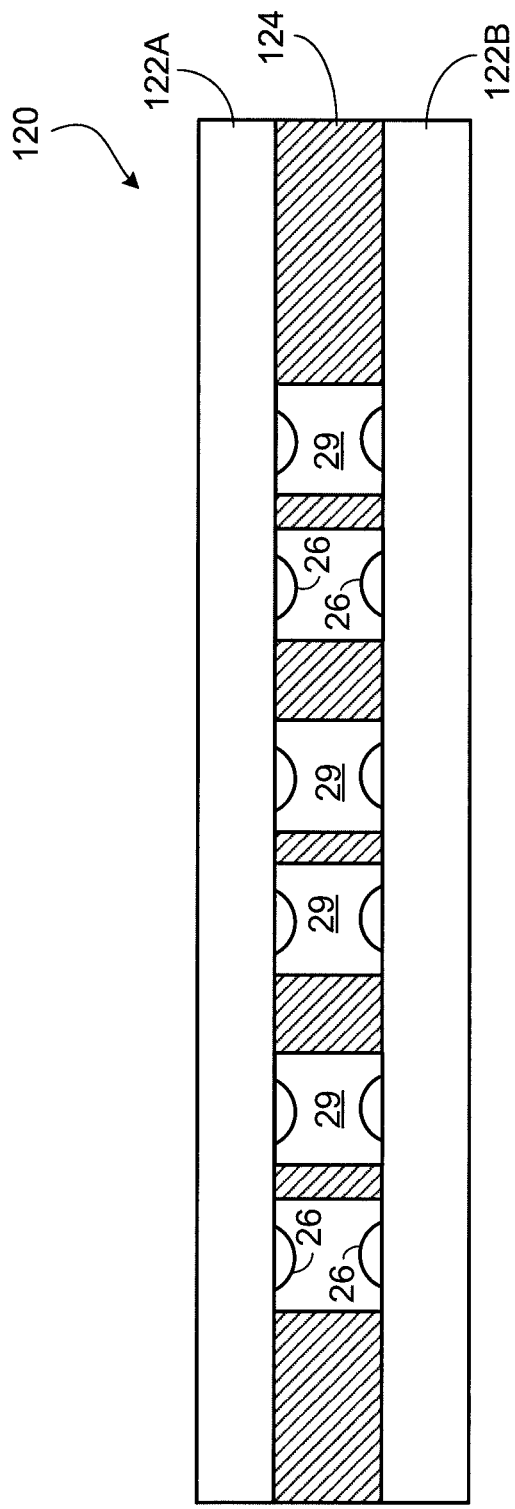
FIG. 2 illustrates an example of a wafer stack including at least one optics wafer.

In an example of a wafer-level process, a first optics wafer 122A and a second optics wafer 122B are attached by adhesive (e.g., glue) to a spacer wafer 124 having openings 29, as shown in FIG. 2. The glue can be deposited, for example, by a screen printing or other suitable technique. The adhesive can be, for example, a heat-curable and/or UV-curable epoxy resin. The optics wafers 122A, 122B and spacer wafer 124 then are aligned and bonded together. The result is a wafer stack 120 as illustrated, for example, in FIG. 2.

The spacer wafer 124 can be composed, for example, of a UV- or thermally-curing epoxy (or other polymer), which in some cases may contain carbon black (or other dark pigment) or an inorganic filler or a dye to achieve desired optical properties. Various polymer materials (e.g., epoxy resin, acrylate, polyurethane, or silicone materials) can be used as the base material for the spacer wafer 124.

The first and second optics wafers 122A, 122B can be composed of a transparent material, such as glass or polymer material. In the example of FIG. 2, each of the optics wafers 122A, 122B includes multiple beam shaping elements (e.g., lenses) 26 on its surface. The lenses 26 can be formed on the optics wafers 122A, 122B, for example, by a replication process, which refers to a technique by means of which a given structure or a negative thereof is reproduced, e.g., etching, embossing, molding or vacuum injection. In a particular example of a replication process, a structured surface is embossed into a liquid, viscous or plastically deformable material, then the material is hardened, e.g., by curing using ultraviolet radiation or heating, and then the structured surface is removed. Thus, a replica (which in this case is a negative replica) of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state.

Figure 3:
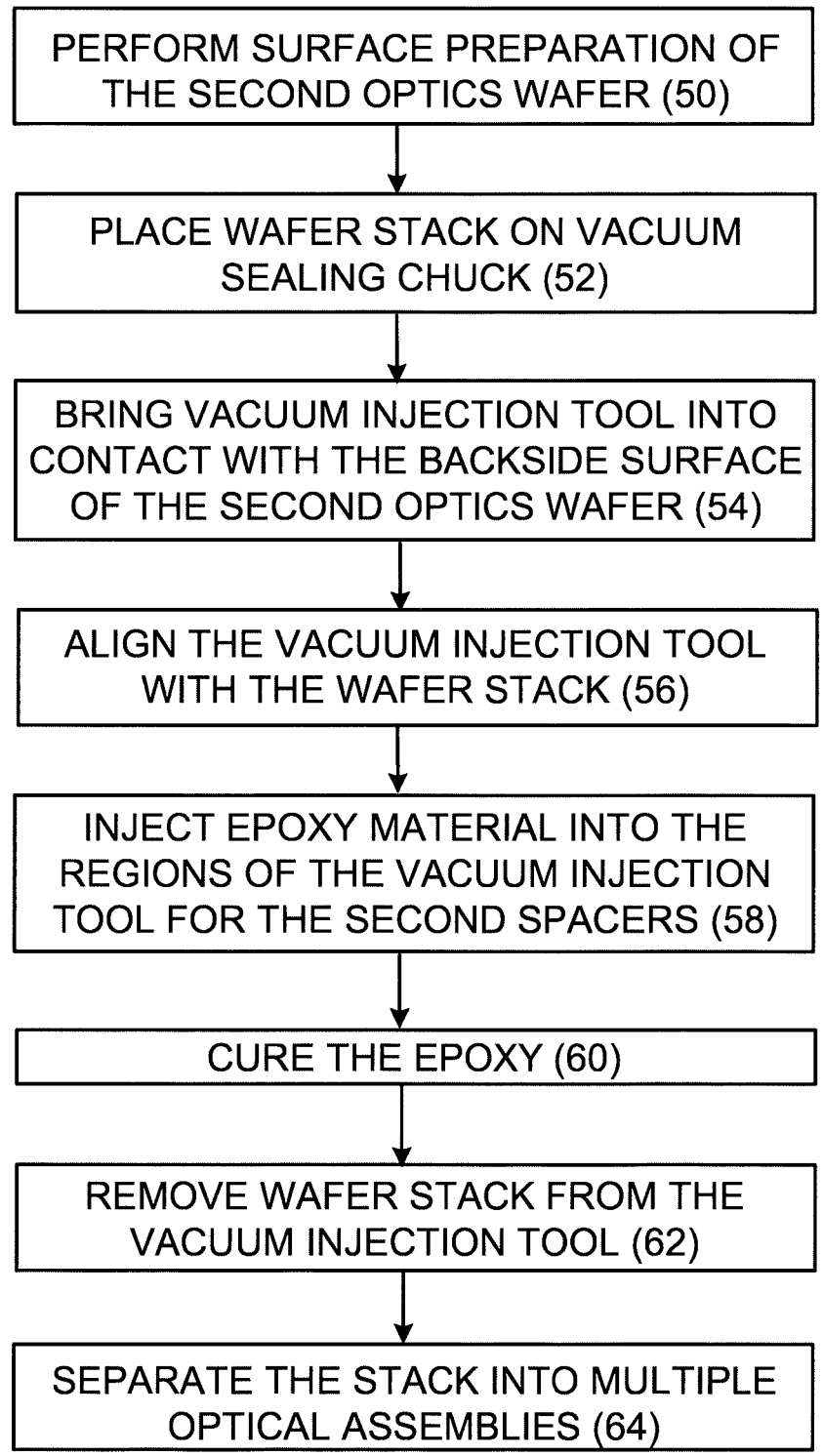
FIG. 3 is a flow chart illustrating an example wafer-level process of fabricating optical assemblies.

Prior to forming vacuum injected molded spacers on the second optics wafer 122B, surface preparation can be performed with respect to the backside surface of the second optics wafer 122B (see FIG. 3 at 50). For example, the backside surface of the optics wafer 122B can be cleaned to improve its adherence properties. In some instances, the surface preparation may include altering the wettability or other characteristics of the optics wafer surface. Thus, in some cases, the backside of the second optics wafer 122B (i.e., the surface of the optics wafer 122B opposite the surface on which the replicated lenses 26 were formed) is subjected to $O_2$ plasma.

Next, as shown in FIG. 4A, the wafer stack 120 is placed on a flat PDMS vacuum sealing chuck 202 such that the backside of the first optics wafer 122A is in contact with the vacuum sealing chuck (see also FIG. 3 at 52). Thus, the surface of the optics wafer 122A opposite the surface on which the replicated lenses 26 were formed rests on the vacuum sealing chuck 202. A vacuum injection tool 204 then is brought into contact with the backside surface of the second optics wafer 122B (FIG. 3 at 54). The vacuum injection tool 204 includes regions 208 that define the shape and position of the second spacers to be formed on the backside of the second optics wafer 122B. The regions 208 can form a grid or array of spaces arranged to correspond to the pitch of the spacers defied by the spacer wafer 124. In some cases, an annular seal plate 206 is disposed between the vacuum sealing chuck 202 and the vacuum injection tool 204. The vacuum injection tool 204 is aligned with the wafer stack 120 such that the regions 208 for the second spacers 28 are positioned in line with the corresponding portions of the spacer wafer 124 (see also FIG. 3 at 56). For this purpose, the tool 204 and/or the optics wafer 122B can include alignment marks.

A vacuum pump 210 can be provided near the outlet 212 of the vacuum sealing chuck 202 to facilitate flowing of the injected material (e.g., SO4 or other epoxy), via inlet 214, into the regions 208 for the second spacers (FIG. 3 at 58). Once the injected epoxy material fills the regions 208 of the vacuum injection tool 204, the epoxy can be is cured (i.e., hardened), for example by UV and/or thermal curing (FIG. 3 at 60). In some instances, the UV radiation used for curing can be incident from the vacuum injection tool side, in which case the tool 204 needs to be transparent to the UV radiation. The result is a wafer stack that include spacers 28 on the backside of the second optics wafer 122B. Thus, the process results in spacers 28 that are molded directly to the surface of the second optics wafer 122B. Since adhesive is not needed in this stage of the processing, the process can help alleviate problems that otherwise might occur if glue or other adhesive were used (e.g., migration of the glue to sensitive areas of the wafer stack; absorption of moisture into the spacer wafer). Molding the spacers 28 directly onto the optics wafer 122B can, in some implementations, reduce misalignment and/or handling distortions.

Further, in some cases, some of the epoxy 220 can be injected into spaces 219 at the circumference of the wafer stack 120 (see FIGS. 4A and 5). Once the epoxy is cured, the epoxy 220 in the spaces 219 surrounding the circumference of the stack 120 helps hold the wafers 122A, 124, 122B together and helps make the wafer stack more robust (see FIG. 5). The vacuum injected molded epoxy 220 thus can help prevent occurrence of misalignments or other distortions in the wafer stack. In some cases, the tool 204 can be shaped so that some of the injected epoxy 220 is present on the upper (i.e., tool-side) surface of the second optics wafer 122B near its periphery. As shown in the example of FIG. 5, this results in a hook-shape for the epoxy around the circumference of the stack 120, which can hold the stack together even better. Likewise, in some cases, the vacuum sealing chuck 202 can be shaped so that some of the injected epoxy 220 is present on the lower (i.e., sealing chuck-side) surface of the first optics wafer 122A. By providing epoxy 220 around the circumference of the wafer stack 120 and also on the outer surfaces of both optics wafers 122A, 122B near their respective peripheries, the epoxy 220 can serve as clamp to hold the wafers in the stack 120 together and help prevent misalignment or other distortions. In the foregoing implementations, the epoxy 220 that helps hold the wafer stack 120 together is molded directly to the wafers 122A, 124, 122B in the stack.

Figure 4B:
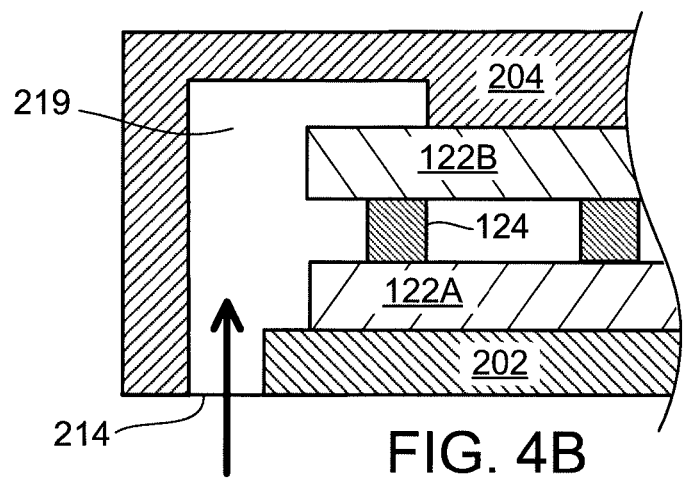
FIGS. 4B, 4C and 4D illustrate further examples of wafer stacks in vacuum injection tools.
Figure 4C:
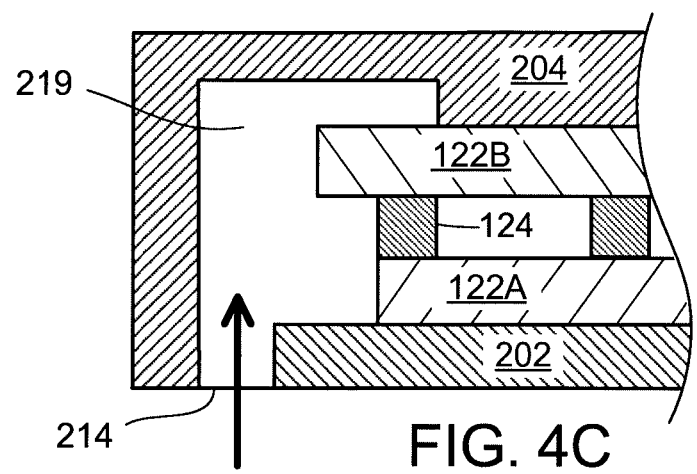
Figure 4D:
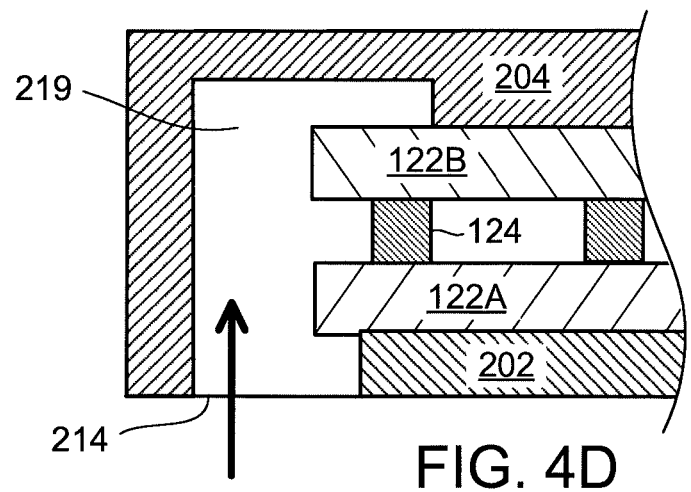

In some implementations, for example, as shown in FIGS. 4A and 5, the outer lateral dimensions of the optics wafers 122A, 122B and the spacer wafer 124 can be substantially the same as one another. In other implementations, however, as shown in the example of FIG. 4B, the outer lateral dimensions of the optics wafers 122A, 122B can extend somewhat beyond the outer lateral dimensions of the spacer wafer 124. In some cases, as illustrated in FIG. 4C, the outer lateral dimensions of only one of the optics wafers (e.g., optics wafer 122B) may extend beyond the outer lateral dimensions of the other optics wafer as well as the spacer wafer 124. Further, in some instances, as shown in FIG. 4D, the outer lateral dimensions of both optics wafers 122A, 122B can extend somewhat beyond the outer lateral dimensions of the spacer wafer 124 and beyond the outer lateral dimensions of the vacuum sealing chuck 202. In each of the foregoing examples, the epoxy can be provided not only on the circumference of the wafers 122S, 122B, 124 in the wafer stack, but also can be present one or more surfaces of the optics wafers 122A, 122B near their respective peripheries so as to hold the stack together even better.

Figure 6:
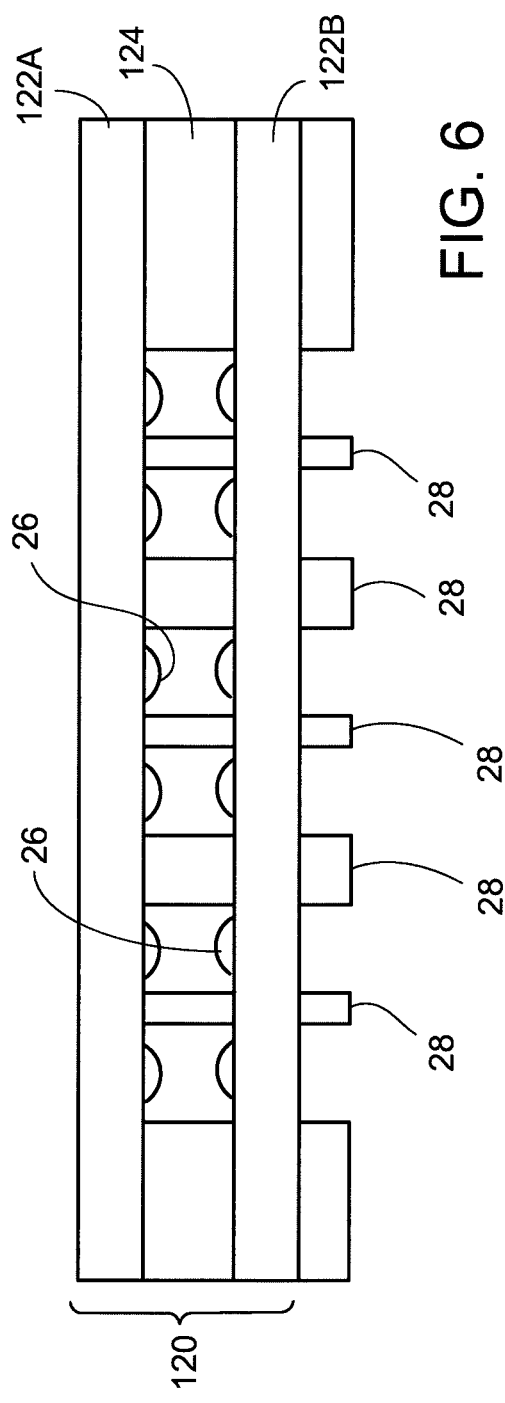
FIG. 6 illustrates an example of the wafer stack after removal from the vacuum injection tool.

Following curing of the epoxy, a cooling and/or epoxy setting period may be allowed to pass before the wafer stack is removed from the vacuum injection tool (FIG. 3 at 62). FIG. 6 illustrates an example of the wafer stack (including the molded spacers 28) after removal from the vacuum injection tool. After removal of the wafer stack from the tool, the stack is separated (e.g., by dicing) into multiple optical assemblies (FIG. at 64). Each optical assembly can include a single optical channel as in the example of FIG. 1, or may include multiple optical channels, such as an array of channels arranged side-by-side.

Figure 7:
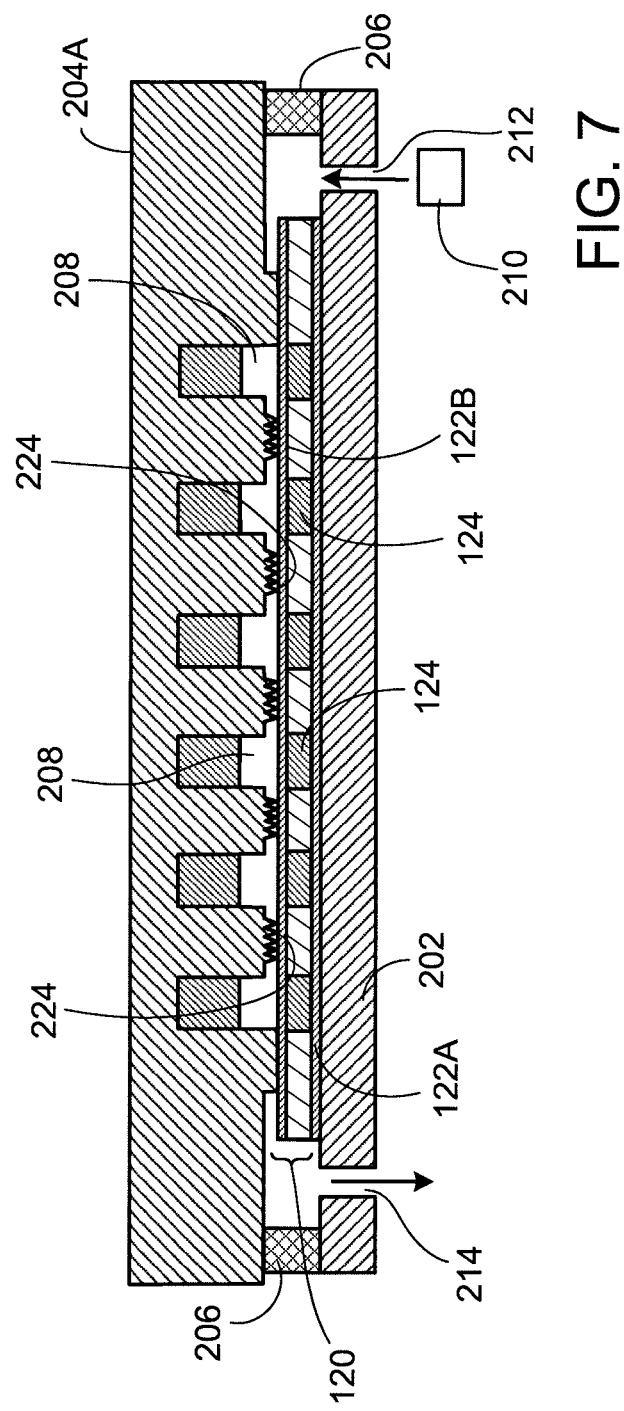
FIG. 7 illustrates another example of a wafer stack in a vacuum injection tool.

In some implementations, the vacuum injection tool can be modified to facilitate the formation of passive optical elements on the same surface of the second optics wafer 122B as the spacers 28. Such passive optical element can redirect light, for example, by refraction and/or diffraction and/or reflection and can include, e.g., one or more lenses or prisms, and can be formed by a replication technique. FIG. 7 illustrates an example of such a tool 204A, which can be used to form spacers as well as passive optical elements directly on an optics wafer that is part of a wafer stack 120.

As shown in FIG. 7, the tool 204A is a combined replication and vacuum injection tool that includes optical element replication sections 224 for formation of the optical elements (e.g., lenses). Prior to bringing the tool 204A into contact with the surface of the optics wafer 122B, replication material is provided on the optical element replication sections 224 of the tool 204A. The replication material should be capable of being brought from a liquid or plastically deformable state into a solid state. An example of the replication material is a UV or thermal-curable transparent epoxy, which can be poured or dispensed onto optical element replication sections 224 of the replication tool 204A. The optics wafer 122B in the stack 120 is brought into contact with spacer replication sections 224 of the tool 204A which causes the replication material to be pressed between the areas defining the optical element replication sections 224 and the surface of optics wafer 122B. Replicated optical elements are thereby embossed on the replication material, which adheres directly to the surface of the optics wafer 122B. Spacers then can be formed directly on the same surface of the optics wafer 122B by vacuum injecting epoxy into the spaces 208 as described above in connection with FIGS. 4 and 5.

Various modifications may be made within the spirit of the invention. Thus, other implementations are within the scope of the claims.

What is claimed is:
1. A wafer-level method of fabricating optical assemblies, the method comprising:
providing a wafer stack that includes a plurality of wafers stacked one over the other, the plurality of wafers including an optics wafer;
after providing the wafer stack, subsequently molding spacers directly onto a surface of the optics wafer, wherein the spacers adhere to the surface of the optics wafer without adhesive; and
forming the spacers by vacuum injection, wherein the vacuum injection includes injecting epoxy into spaces defined by a vacuum injection tool, wherein during the vacuum injection, a portion of the epoxy is disposed around lateral side edges of the provided wafer stack.

2. The method of claim 1 wherein, during the vacuum injection, some of the epoxy is disposed along the lateral side edges of the optics wafer.

3. The method of claim 1 wherein, during the vacuum injection, some of the epoxy is disposed along a surface of the wafer stack at an end of the wafer stack opposite that of the optics wafer.

4. The method of claim 1 wherein, during the vacuum injection, some of the epoxy is disposed along the lateral side edges of the optics wafer and some of the epoxy is disposed along a surface of the wafer stack at an end of the wafer stack opposite that of the optics wafer.

5. The method of claim 1 wherein the wafer stack includes a spacer wafer, and wherein the spacers formed by the vacuum injection are aligned with spacer regions of the spacer wafer.

6. The method of claim 1 wherein the optics wafer is composed of a material selected from a group consisting of: glass, polymer.

7. The method of claim 6 wherein the optics wafer includes passive optical elements on at least one of its surfaces.

8. The method of claim 1 including:
curing the epoxy; and
separating the wafer stack into a plurality of optical assemblies.

9. An optical assembly comprising:
first and second substrates separated from one another by a first spacer having an opening, wherein the substrates are transparent to a particular wavelength or range of wavelengths, the first spacer being attached directly to a surface of the first substrate and to a surface of the second substrate to form a wafer stack;
a beam shaping element on at least one of the substrates; and
a second spacer attached directly to a surface of the second substrate such that the first and second spacers are on opposite sides of the second substrate,
wherein the second spacer adheres to the surface of the second substrate without adhesive, wherein the second spacer includes a vacuum injected epoxy material and is molded on the surface of the second substrate, and wherein a portion of the epoxy material is disposed around the lateral side edges of the wafer stack, and
wherein outer lateral dimensions of the first and second substrates and the first and second spacers are the same as one another.

10. The optical assembly of claim 9 wherein the first and second substrates are composed of a material selected from a group consisting of: glass, polymer.

11. The optical assembly of claim 9 including a respective beam shaping element on each of the first and second substrates.

* * * * *